(12) United States Patent
Ashok et al.

(10) Patent No.: US 8,755,244 B2
(45) Date of Patent: Jun. 17, 2014

(54) WRITE CONTENTION-FREE, NOISE-TOLERANT MULTI-PORT BITCELL

(75) Inventors: Ambica Ashok, Austin, TX (US); Ravindraraj Ramaraju, Round Rock, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 242 days.

(21) Appl. No.: 13/441,414

(22) Filed: Apr. 6, 2012

(65) Prior Publication Data

US 2013/0265818 A1     Oct. 10, 2013

(51) Int. Cl.
*G11C 8/00* (2006.01)
*G11C 11/00* (2006.01)

(52) U.S. Cl.
USPC ...................................... 365/230.05; 365/154

(58) Field of Classification Search
USPC ............................................ 365/230.05, 154
See application file for complete search history.

(56) References Cited

U.S. PATENT DOCUMENTS

| | | | |
|---|---|---|---|
| 6,091,627 A * | 7/2000 | Luo et al. | 365/154 |
| 6,538,954 B2 * | 3/2003 | Kunikiyo | 365/230.05 |
| 6,614,265 B2 | 9/2003 | Buettner et al. | |
| 6,778,466 B2 * | 8/2004 | Walker | 365/230.05 |
| 6,834,024 B2 * | 12/2004 | Frydel | 365/230.05 |
| 7,656,739 B2 * | 2/2010 | Ham | 365/230.05 |
| 7,675,769 B2 | 3/2010 | Sumita | |

OTHER PUBLICATIONS

Riedinger, R.J., et al., "A 32nm 3.1 Billion Transistor 12-Wide-Issue Itanium Processor for Mission-Critical Servers", ISSCC 2011/Session 4/Enterprise Processors & Components/4.8, IEEE International Solid-State Circuits Conference, 2011.

* cited by examiner

*Primary Examiner* — Huan Hoang
*Assistant Examiner* — Tri Hoang
(74) *Attorney, Agent, or Firm* — Mary Jo Bertani; James L. Clingan, Jr.

(57) ABSTRACT

A multi-port memory cell of a multi-port memory array includes a first inverter that inverter is disabled by a first subset of write word lines and a second inverter, cross coupled with the first inverter, wherein the second inverter is disabled by a second subset of the plurality of write word lines. A first selection circuit has data inputs coupled to a first subset of a plurality of write bit lines, selection inputs coupled to the first subset of the plurality of write word lines, and an output coupled to the input of the second inverter. The second selection circuit has data inputs coupled to a second subset of the plurality of write bit lines, selection inputs coupled to the second subset of the plurality of write word lines, and an output coupled to the input of the first inverter.

20 Claims, 6 Drawing Sheets

US 8,755,244 B2

WRITE CONTENTION-FREE, NOISE-TOLERANT MULTI-PORT BITCELL

BACKGROUND

1. Field

This disclosure relates generally to semiconductor devices, and more specifically, to multi-port bitcells.

2. Related Art

In a typical register-file bit-cell, a successful write operation relies on a correct ratio in the size of the transistors so that the write driver can over-power the latching transistors within the bit-cell. Even though the bitcell can be optimized for writes, write failures have been observed at low voltage and low temperature.

Moreover, multi-threading microprocessors are increasingly opting for register files with many read and write ports. Incorporating a large number of ports increases capacitance on the storage nodes, which can cause longer write times. A large number of write ports introduces other concerns such as additional noise coupling into the storage node from switching write bitlines.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION OF THE DRAWINGS

Embodiments of devices and methods for a reliable, noise tolerant register file bitcell with multiple decoupled read and write ports that operate reliably at a low voltage and temperature are disclosed herein. The writes are free of contention, so that a write failure does not occur due to improper ratios between the write bit line driver and latching transistors. Noise coupling into the storage nodes from multiple switching write bit-lines is minimized, and capacitance on the either of the storage nodes is reduced and balanced to improve write time.

Figure 1:
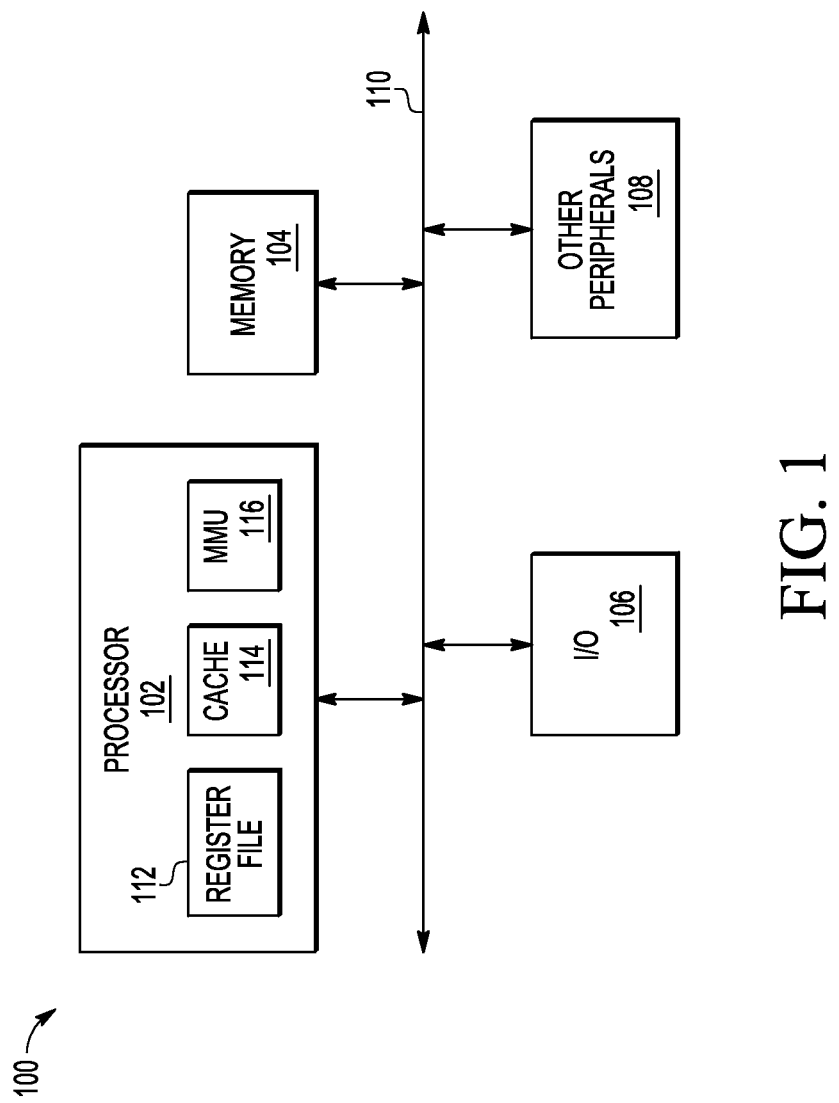
FIG. 1 shows a computer processing system in which a write contention-free, noise-tolerant multi-port bitcell can be implemented according to some embodiments of the disclosure.

FIG. 1 shows a computer processing system 100 in which a write contention-free, noise-tolerant multi-port bitcell can be implemented according to some embodiments of the disclosure. In the illustrated embodiment, components in computer processing system 100 include processor 102, memory module 104, input/output (I/O) handlers/interfaces 106, and other peripheral devices or modules 108 which are bi-directionally coupled to bus 110 to allow communication between components. Processor 102 includes register file 112, Level 1 cache memory modules 114 and memory management unit (MMU) 116. Processor 102 can be a superscalar processor in which multiple instructions execute out-of-order simultaneously.

Bus 110 may communicate external to computer processing system 100. Alternate embodiments of the present disclosure may use more, less, or different components and functional blocks than those illustrated in FIG. 1. As some possible examples, alternate embodiments of computer processing system 100 may include a timer, a serial peripheral interface, a digital-to-analog converter, an analog-to digital converter, a driver (e.g. a liquid crystal display driver), and/or a plurality of types of memory.

Register file 112 includes registers that are used to temporarily store data and addresses while instructions are executing. Register file 112 can also include checkpoint registers that are used to store the state of the architectural registers when a redirection occurs due to a load instruction exception or a branch instruction misprediction. Any suitable number of registers having any suitable number of bits per register data word can be included in register file 112. For example, in some implementations, there may be 32 registers that each have 64 bits of data.

MMU 116 is capable of providing various cache memory and bus control signals high-speed as well as virtual address to physical address translation. The virtual address is an address that is generated by processor 102 and as viewed by code that is executed by processor 102. The physical address is used to access the various higher-level memory banks such as a level-one RAM memory.

In alternate embodiments, computer processing system 100 may include one, two, or any number of processors 102. If a plurality of processors 102 are used in computer processing system 100, any number of them may be the same, or may be different. Note that although computer processing system 100 may have a plurality of processors 102, a single processor 102 which by itself can execute a plurality of instruction sets.

Memory module 104 can include a multi-level cache architecture including one or more levels of instruction cache and data cache module that have slower access rates than Level 1 cache modules 114. Memory module 104 can also include an external memory that is also referred to as a main memory and can optionally include additional devices such as buffers and the like.

Figure 2:
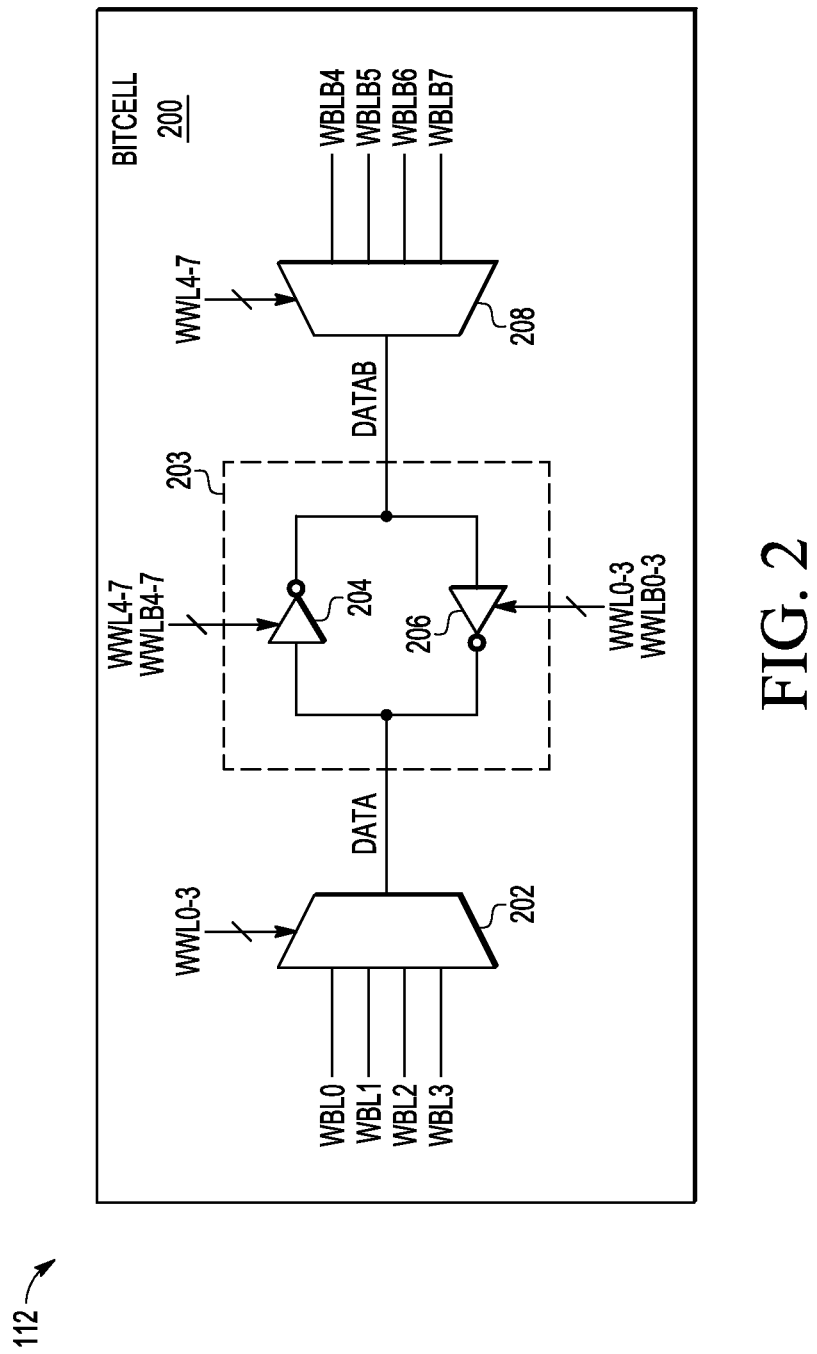
FIG. 2 shows an embodiment of multi-port memory bitcell that can be implemented in the register file shown in FIG. 1.

Referring to FIG. 2, an embodiment of multi-port memory bitcell 200 that can be implemented in register file 112 is shown that includes multiplexor 202, inverters 204, 206, and multiplexor 208. Inverters 204, 206 comprise a storage element 203 and may also be referred to as feedback circuits. Inverter 204 is coupled in parallel to inverter 206 so that the output of inverter 204 is coupled to the input of inverter 206, and the output of inverter 206 is coupled to the input of inverter 204. The output of multiplexor 202 is coupled to the output of inverter 206 and the input of inverter 204. The output of multiplexor 208 is coupled to the output of inverter 204 and the input of inverter 206.

Although only one bitcell 200 is shown, each register in register file 112 can comprise multiple bitcells 200, such as 32 or 64 bitcells, for example. Additionally, although bitcell 200 is shown as having eight write ports (numbered 0-7), bitcell 200 can include any suitable number of write ports greater or less than eight.

First selection circuit or multiplexor 202 receives write bitlines Wbl0-Wbl3 as input and write word line select signals (WWL0-WWL3) as control inputs.

Second selection circuit or multiplexor 208 receives write bitlines WBLB4-WBLB7 as input and write word line select signals (WWL4-WWL7) as control inputs.

Inverter 204 receives input from multiplexor 202, and control signals from inverse write word line select signals 4-7 (WWLB4-WWLB7), and write word line select signals 4-7 (WWL4-WWL7). If one of the write word line signals (WWL4-WWL7) is asserted to allow multiplexor 208 to pass the write data from one of the write bit lines (WBLB4-WBLB7), the inverter 204 is disabled to avoid contention with the multiplexor 208 and inverter 206 receives the data from the multiplexor 208 and provides the inverted data of the multiplexor 208 at the data node.

Inverter 206 receives input from multiplexor 208, and control signals from inverse write word line select signals 0-3 (WWLB0-WWLB3) and write word line select signals 0-3 (WWL0-WWL3). If one of the write word line signals (WWL0-WWL3) is asserted to allow multiplexor 202 to pass the write data from one of the write bit lines (WBL0-WBL3), the inverter 206 is disabled to avoid contention with the multiplexor 202 and inverter 204 receives the data from the multiplexor 202 and provides the inverted data of the multiplexor 202 at the datab node.

Bitcell 200 is designed to balance the capacitance on the data and datab bitcell storage nodes. Half of the write ports (0-3) can perform a single-ended write through multiplexor 202 into the data storage node, and the other half of the write ports (4-7) can perform a single-ended write through multiplexor 208 into the datab storage node.

Figure 3:
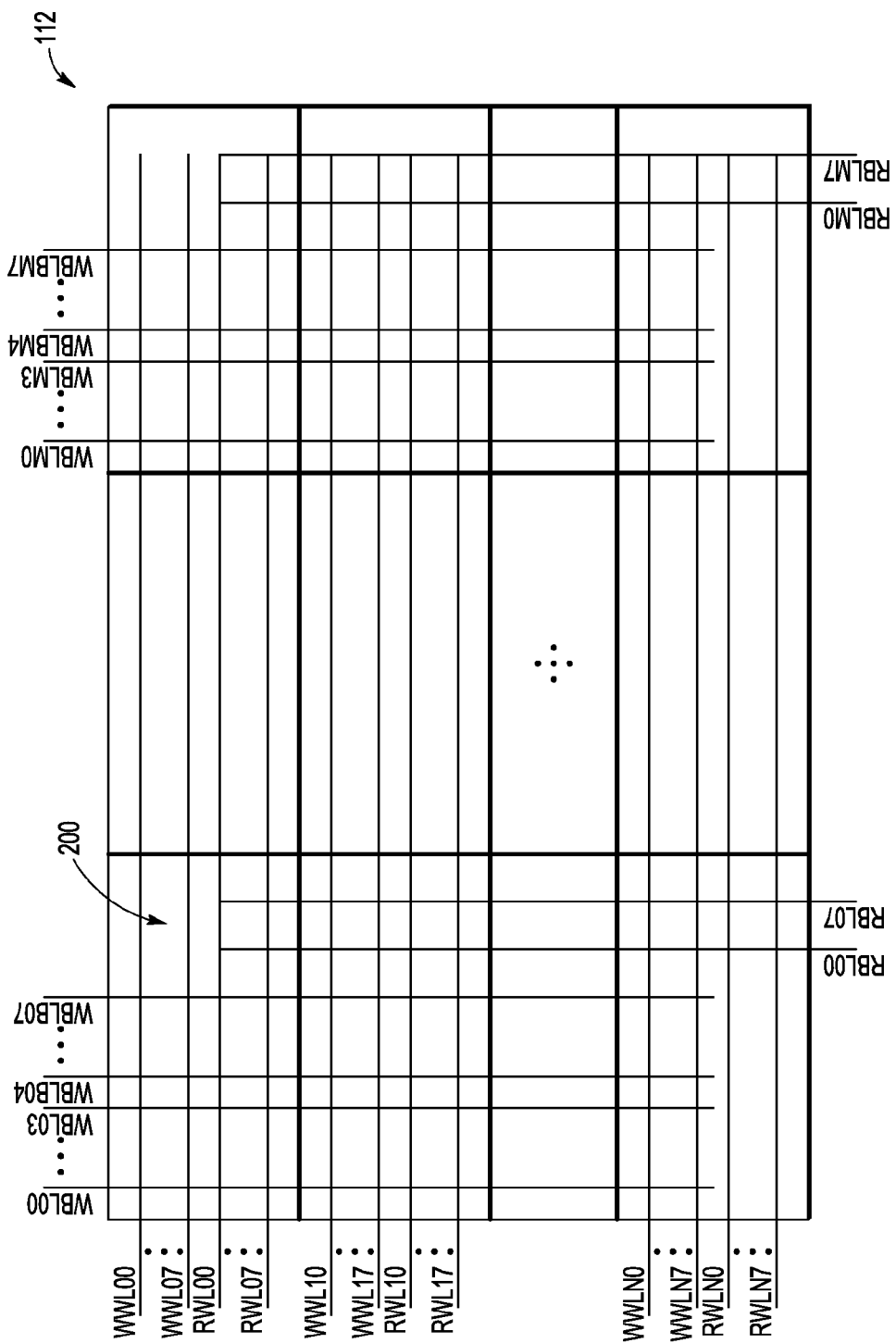
FIG. 3 shows an embodiment of a portion of the register file of FIG. 1 with a two-dimensional array of bitcells.

Referring to FIG. 3, an embodiment of a portion of register file 112 is shown with a two-dimensional array of bitcells having 0-M columns and 0-N rows. Bitcell 200 is shown in the upper left corner, however, bitcell 200 can be in any location of the array. For a write operation, each bitcell is addressed according to a write word line to indicate the row and a write bit line to indicate the column. For a read operation, each bitcell is addressed according to a read word line to indicate the row and a read bit line to indicate the column. The write word line, write bit line, read word line, and read bitline signals can further specify a particular port in the bitcell. For example, write word line row 0, port 0 (WWL00) and write bit line column 0, port 0 (WBL00) can be specified to write to the first port of the bitcell in the first column of the first row. As another example, read word line row N, port 7 (RWLN7) and read bit line column M, port 7 (RBLM7) can be specified to read the seventh port of the bitcell in the Mth column of the Nth row.

Figure 4:
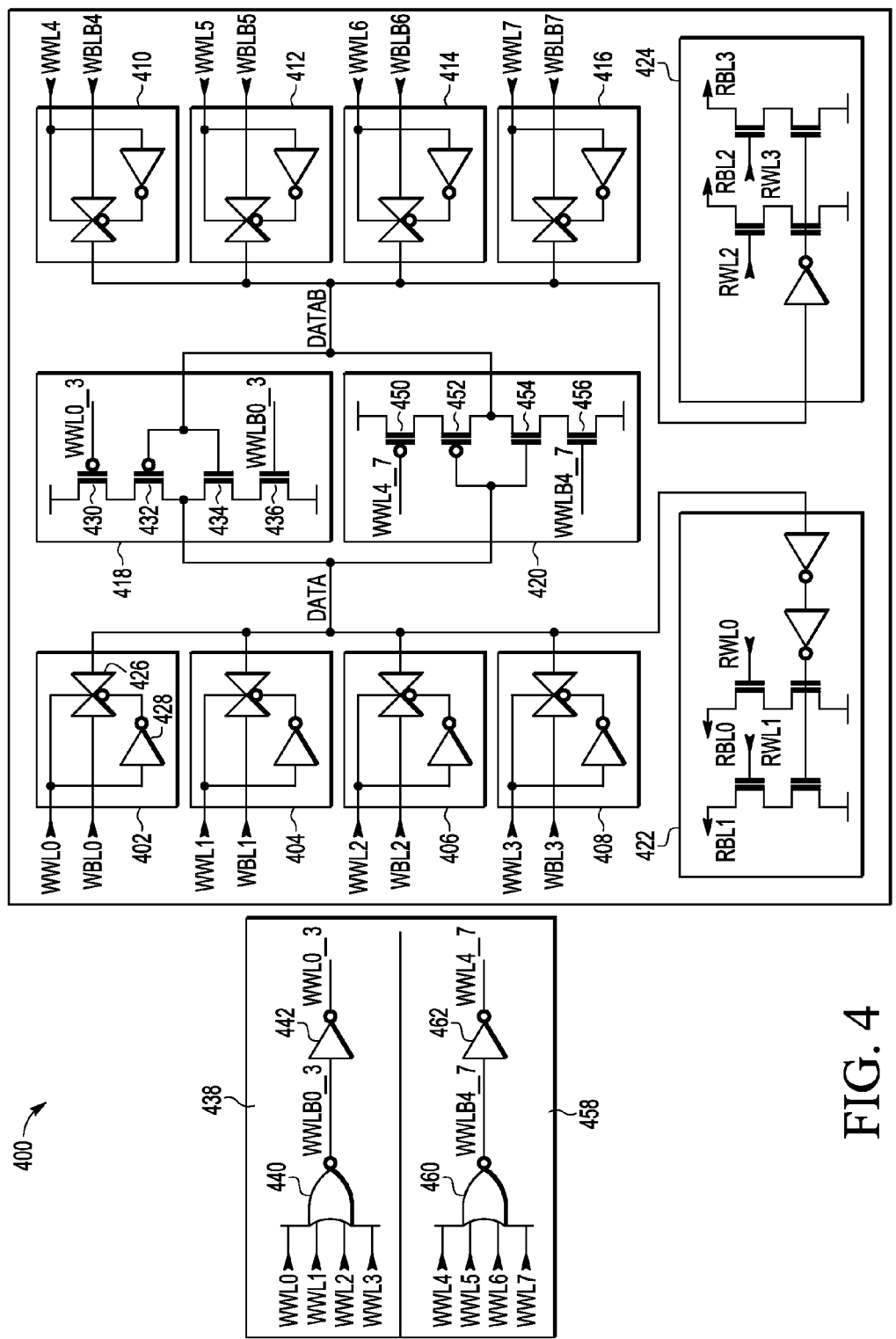
FIG. 4 shows another embodiment of a multi-port bitcell that can be implemented in the register file of FIG. 1.

Referring to FIG. 4, bitcell 400 is another embodiment of a multi-port bitcell that can be implemented in register file 112 (FIG. 1) that includes four read ports, eight write ports and write contention-free features. Four write ports 402, 404, 406, 408 are coupled as input to a data node and another four write ports 410, 412, 414, 416 are coupled as input to a datab node. Data node is connected to the output of the first set of write ports 402-408 and to the output of feedback circuit 418 and the input to feedback circuit 420. Datab node is connected to the output of the second set of write ports 410-416 and to the output of feedback circuit 420 and the input to feedback circuit 418.

Feedback circuits 418, 420 are coupled in parallel with the output of feedback circuit 418 connected to the input of feedback circuit 420, and the output of feedback circuit 420 connected to the input of feedback circuit 418.

Output or read pulldown circuit 422 has two ports (0, 1) and is connected to the data node. Output or read pulldown circuit 424 has two ports (2, 3) and is connected to the datab node. Operation of output or read pulldown circuit 422, 424 is controlled by respective read word line signals (RWL0-RWL1, RWL2-RWL3) and read bit line signals (RBL0-RBL1, RBL2-RBL3).

Each write port 402-416 includes a transmission gate 426 and an inverter 428. Control input to the transmission gate 426 includes a respective write word line signal (WWL0-WWL7), and the inverse of the respective write word line signal (WWLB0-WWLB7) provided by the inverter 428. Respective write bit line signals (WBL0-WBL3, WBLB4-WBLB7) are allowed to pass through transmission gates 426 when the corresponding write word line signal (WWL0-WWL7) is set (e.g., the signal is a Logic 1).

Feedback circuit 418 includes PMOSFET 430 coupled in series to PMOSFET 432, PMOSFET 432 coupled in series to NMOSFET 434, and NMOSFET 434 coupled in series to NMOSFET 436. A control input to PMOSFET 430 is a write word line feedback control signal (WWL0_3) that is generated by driver circuit 438. A control input to NMOSFET 436 is an inverse write word line feedback control signal (WWLB0_3) that is also generated by driver circuit 438. Driver circuit 438 includes a NOR gate 440 coupled in series with inverter 442. Input to NOR gate 440 includes write word line signals from write ports 0 through 3 (WWL0-WWL3). If one of the WWL0-WWL3 signals is set to Logic 1, the output signal ((WWLB0_3) of NOR gate 440 is Logic 0. If all of the WWL0-WWL3 signals are set to Logic 0, the output signal (WWLB0_3) of NOR gate 440 is Logic 1. The output signal WWLB0_3 of NOR gate 440 is input to NMOSFET 436 and to inverter 442. Inverter 442 inverts the signal WWLB0_3 to produce inverter output signal WWL0_3 that is provided as input to PMOSFET 430.

Feedback circuit 420 includes PMOSFET 450 coupled in series to PMOSFET 452, PMOSFET 452 coupled in series to NMOSFET 454, and NMOSFET 454 coupled in series to NMOSFET 456. A control input to PMOSFET 450 is a write word line feedback control signal (WWL4_7) that is generated by driver circuit 458. A control input to NMOSFET 456 is an inverse write word line feedback control signal (WWLB4_7) that is also generated by driver circuit 458. Driver circuit 458 includes a NOR gate 460 coupled in series with inverter 462. Input to NOR gate 460 includes write word line signals from write ports 4 through 7 (WWL4-WWL7). If one of the WWL4-WWL7 signals is set to Logic 1, the output signal ((WWLB4_7) of NOR gate 460 is Logic 0. If all of the WWL4-WWL7 signals are set to Logic 0, the output signal (WWLB4_7) of NOR gate 460 is Logic 1. The output signal WWLB4_7 of NOR gate 460 is input to NMOSFET 456 and to inverter 462. Inverter 462 inverts the signal WWLB4_7 to produce inverter output signal WWL4_7 that is provided as input to PMOSFET 450.

To prevent write-contention by the multiple write ports in bitcell 400, a feedback signal from the data node (output by feedback circuit 418) is provided to feedback circuit 420. Correspondingly, a feedback signal from the datab node (output by feedback circuit 420) is provided to feedback circuit 418. One of feedback circuit 418, 420 is disabled when signals are transmitted by the write ports driving the input of the other feedback circuit 418, 420. There will be no write contention since the disabled feedback circuit will not oppose the transmission gate that is conducting. Bitcell 400 allows a single-ended write to be performed through a single transmission gate. The write wordlines for all the write ports are logic 0 or the write word line for one of the write ports is logic 1, and when the write wordline for the respective write port that is writing into the bitcell 400 is asserted, the associated transmission gate is conducting, and the feedback circuit whose output is coupled to the conducting transmission gate is disabled, allowing write data into bitcell 400 unopposed. For example, when one of write ports 402-408 is transmitting (writing), feedback circuit 420 is enabled and feedback circuit 418 is disabled. Conversely, when one of write ports 410-416 is transmitting (writing), feedback circuit 418 is enabled and feedback circuit 420 is disabled.

Figure 5:
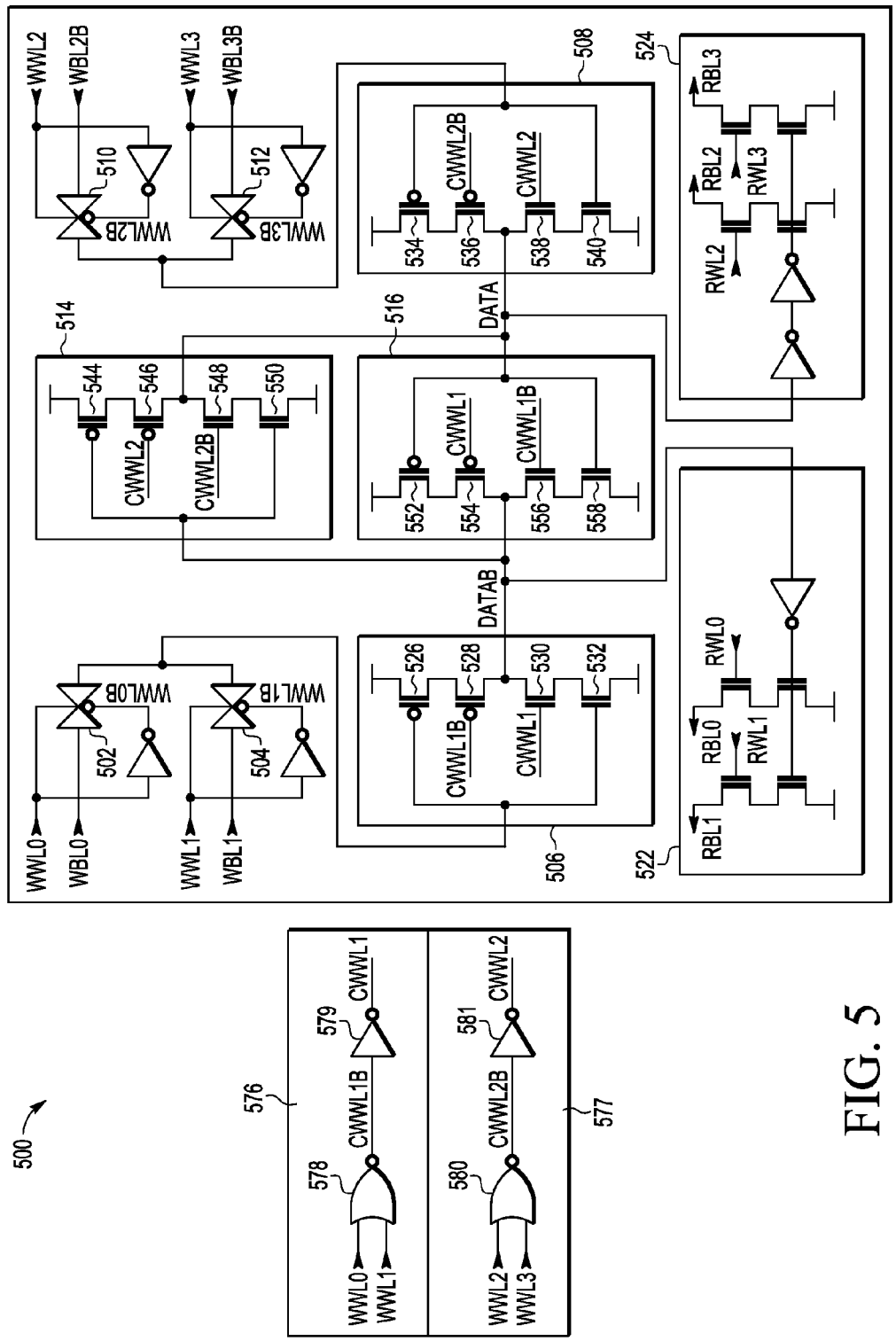
FIG. 5 shows another embodiment of a multi-port bitcell that can be implemented in the register file of FIG. 1.

Referring to FIG. 5, bitcell 500 is another embodiment of a multi-port bitcell that can be implemented in register file 112 of FIG. 1 that includes four read ports, four write ports, and noise-tolerant and write contention-free features. Two write ports 502, 504 are coupled as input to a first tristate device 506 and another two write ports 510, 512 are coupled as input to a second tristate device 508.

Datab node is connected to the output of tristate device 506 and to the output of feedback circuit or inverter 516 and the input to feedback circuit or inverter 514. Data node is connected to the output of tristate device 508 and to the output of feedback circuit 514 and the input to feedback circuit 516.

Feedback circuits 514, 516 are coupled in parallel, with the output of feedback circuit 514 connected to the input of feedback circuit 516, and the output of feedback circuit 516 connected to the input of feedback circuit 514.

Read pulldown circuit 522 has two ports (0, 1) and is connected to the datab node. Read pulldown circuit 524 has two ports (2, 3) and is connected to the data node. Operation of read pulldown circuit 522, 524 is controlled by respective read word line signals (RWL0, RWL1; RWL2, RWL3) and read bit line signals (RBL0, RBL1; RBL2, RBL3).

In the embodiment shown, write ports 502-504 are implemented with a transmission gate that receives a respective write bit line signal (WBL0, WBL1), a write word line signal (WWL0, WWL1), and the inverse of the respective write word line signal (WWL0B, WWL1B), which is output by a respective inverter that receives the corresponding write word line signal. Respective write bit line signals (WBL0, WBL1) are allowed to pass through the transmission gates when the corresponding write word line signal (WWL0, WWL1) is set (e.g., the signal is a Logic 1). Write ports 510-512 are implemented with a transmission gate that receives a respective inverse write bit line signal (WBL2B, WBL3B), a write word line signal (WWL2, WWL3), and the inverse of the respective write word line signal (WWL2B, WWL3B), which is output by a respective inverter that receives the corresponding write word line signal. Respective write bit line signals (WBL2B, WBL3B) are allowed to pass through the transmission gates when the corresponding write word line signal (WWL2, WWL3) is set (e.g., the signal is a Logic 1).

Tristate device 506 includes PMOSFET 526 coupled in series to PMOSFET 528, PMOSFET 528 coupled in series to NMOSFET 530, and NMOSFET 530 coupled in series to NMOSFET 532. The output of write ports 502, 504 (i.e., WBL0 or WBL1, depending on which transmission gate is conducting) are provided as a control input to PMOSFET 526 and NMOSFET 532. Driver circuit 576 includes a NOR gate 578 coupled in series with inverter 579. Input to NOR gate 578 includes write word line signals from write ports 0 and 1 (WWL0 and WWL1). If one of the WWL0 or WWL1 signals is set to Logic 1, the output signal of NOR gate 578 is Logic 0. If both of the WWL0 and WWL1 signals are set to Logic 0, the output signal of NOR gate 578 is Logic 1. A control input to PMOSFET 528 is the inverse of a combined write word line feedback control signal (CWWL1B) that is generated by NOR gate 578 in driver circuit 576. A control input to NMOSFET 530 is the combined write word line feedback control signal (CWWL1) that is generated by inverter 579 in driver circuit 576.

Tristate device 508 includes PMOSFET 534 coupled in series to PMOSFET 536, PMOSFET 536 coupled in series to NMOSFET 538, and NMOSFET 538 coupled in series to NMOSFET 540. The output of write ports 510, 512 (i.e., WBL2B or WBL3B, depending on which transmission gate is conducting) are provided as a control input to PMOSFET 534 and NMOSFET 540. Driver circuit 577 includes a NOR gate 580 coupled in series with inverter 581. Input to NOR gate 580 includes write word line signals from write ports 2 and 3 (WWL2 and WWL3). If one of the WWL2 or WWL3 signals is set to Logic 1, the output signal of NOR gate 580 is Logic 0. If both of the WWL2 and WWL3 signals are set to Logic 0, the output signal of NOR gate 580 is Logic 1. A control input to PMOSFET 536 is the inverse of a combined write word line feedback control signal (CWWL2B) that is generated by NOR gate 580 in driver circuit 577. A control input to NMOSFET 538 is the combined write word line feedback control signal (CWWL2) that is generated by inverter 581 in driver circuit 577.

Feedback circuit 514 includes PMOSFET 544 coupled in series to PMOSFET 546, PMOSFET 546 coupled in series to NMOSFET 548, and NMOSFET 548 coupled in series to NMOSFET 550. A control input to PMOSFET 544 and NMOSFET 550 is the signal on the datab node. A control input to PMOSFET 546 is the combined write word line signal (CWWL2) from driver 577. A control input to NMOSFET 548 is the inverse combined write word line signal (CWWL2B) from driver 577.

Feedback circuit 516 includes PMOSFET 552 coupled in series to PMOSFET 516, PMOSFET 516 coupled in series to NMOSFET 556, and NMOSFET 556 coupled in series to NMOSFET 558. A control input to PMOSFET 552 and NMOSFET 558 is the signal on the data node. A control input to PMOSFET 516 is the combined write word line signal (CWWL1) from driver 576. A control input to NMOSFET 556 is the inverse combined write word line signal (CWWL1B) from driver 576.

A feedback signal from the data node (output by feedback circuit 514) is provided to feedback circuit 516. Correspondingly, a feedback signal from the datab node (output by feedback circuit 516) is provided to feedback circuit 514. To prevent write-contention by the multiple write ports in bitcell 500, one of feedback circuit 514, 516 is disabled when signals are transmitted by the write ports driving the input of the other feedback circuit 514, 516. There will be no write contention since the disabled feedback circuit will not oppose the transmission gate that is conducting. Bitcell 500 allows a single-ended write to be performed through a single transmission gate. The write wordlines for all the write ports are logic 0 or the write word line for one of the write ports is logic 1, and when the write wordline for the respective write port that is writing into the bitcell 500 is asserted, the associated transmission gate is conducting, and the feedback circuit whose output is coupled to the storage node being written is disabled, allowing write data into bitcell 500 unopposed. For example, when one of write ports 502, 504 is transmitting (writing), feedback circuit 514 is enabled and feedback circuit 516 is disabled. Conversely, when one of write ports 510, 512 is transmitting (writing), feedback circuit 516 is enabled and feedback circuit 514 is disabled.

Transmission gates 502 are tristate devices that controlled by a combination of write word line, inverse write word line, and write bit line signals. Transmission gates of write ports 502, 504, 510, 512 are open when a write happens through any of the associated write ports 502, 504, 510, 512 (i.e., ports 0-1 or ports 2-3), and is shut off when a write is not occurring through any of the write ports 502, 504, 510, 512. In bitcell 500, tristate devices 506, 508 helps to mitigate any noise coupling through the transmission gates 502, 504, 510, 512 into the storage nodes (data node and datab node) of the bitcell 500, when multiple write bitlines switch opposite to the value held in the bitcell 500.

Figure 6:
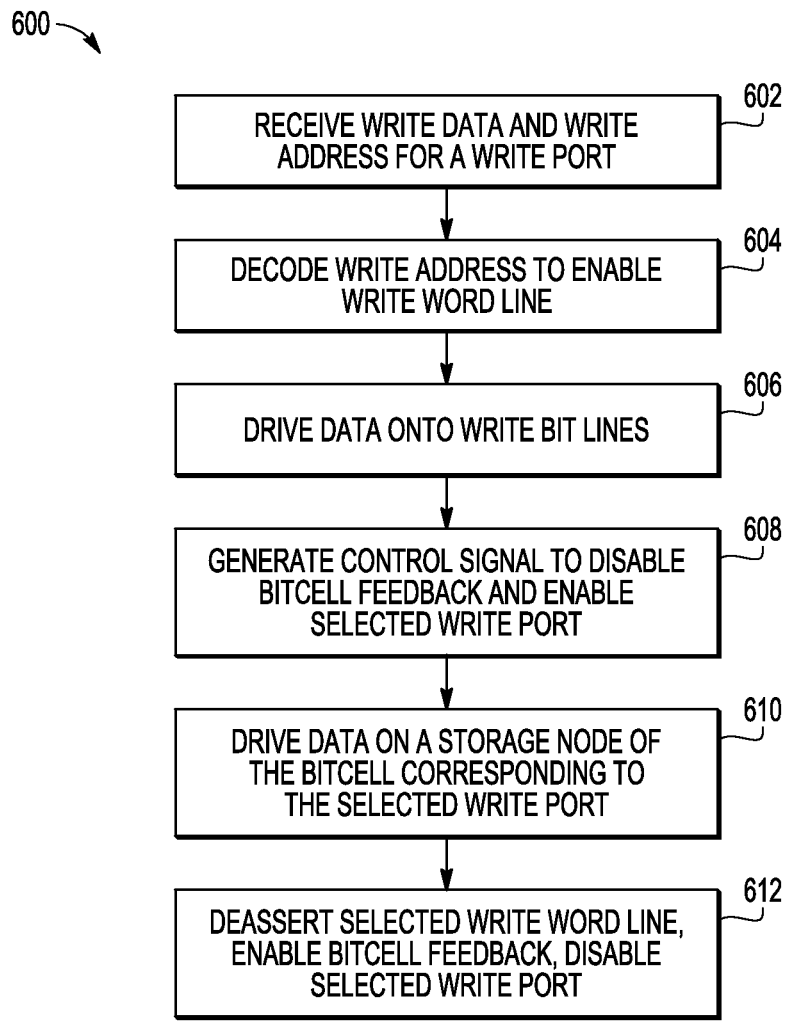
FIG. 6 shows a flow diagram of an embodiment of a method for operating a multi-port bitcell that can be used in the register file of FIG. 1.

FIG. 6 shows a flow diagram of an embodiment of a method 600 for operating a bitcell with multiple write ports, such as bitcell 200 (FIG. 2), bitcell 400 (FIG. 4), or bitcell 500 (FIG. 5), that can be used in the register file 112 of FIG. 1. Process 602 can include receiving write data and a corresponding write address in register file 112. The address and data correspond to a particular write port in the register file. Process 604 can include decoding the write address to determine which bitcell to write the data. The corresponding write word line of the bitcell and write port is then enabled.

Process 606 can include driving the data onto the write bit line corresponding to the enabled write port.

The write ports are grouped in two or more subsets. Process 608 can include generating a control signal for each subset of write ports by NOR-ing write word lines from the respective subsets. If one of the write word line signals in each subset is set to Logic 1, the output signal of the corresponding NOR gate is Logic 0. If all of the write word line signals in each subset are set to Logic 0, the output signal of the corresponding NOR gate is Logic 1. A corresponding write bit line is selected from the subset of the write bit lines with a write word line asserted. The control signals are used to disable feedback circuit(s) associated with the subset(s) of write ports that do not have a write word line asserted as well as to enable the selected write port. The disabled feedback circuits thus do not have to be overpowered to write the data, making the bitcell write contention-free.

Process 610 can include driving the data onto a storage node of the bitcell corresponding to the selected write port.

Process 612 can include deasserting the selected write word line, which in turn enables the disabled feedback circuit (s), and disables the selected write port.

By now it should be appreciated that there has been provided an embodiment f a multi-port memory cell 112 of a multi-port memory module or array 104, wherein the multi-port memory cell 112 can be written using a plurality of write word lines and a plurality of write bit lines. A storage element 203 can comprise a first inverter 206 having an input and an output, wherein the first inverter 206 can be disabled by a first subset WWL0-3 of the plurality of write word lines. A second inverter 204 has an input coupled to the output of the first inverter 206 and an output coupled to the input of the first inverter 206, wherein the second inverter 204 can be disabled by a second subset WWL4-7 of the plurality of write word lines. A first selection circuit has data inputs coupled to a first subset WBL0-3 of the plurality of write bit lines, selection inputs coupled to the first subset of the plurality of write word lines, and an output coupled to the input of the second inverter 204. A second selection circuit 208 has data inputs coupled to a second subset WBL4-7 of the plurality of write bit lines, selection inputs coupled to the second subset of the plurality of write word lines, and an output coupled to the input of the first inverter 206.

In another aspect of the multi-port memory cell 112, a first feedback control circuit 438 has a plurality of inputs coupled to the first subset of the plurality write word lines and an output coupled to the first inverter 206 for disabling the first inverter 206. A second feedback control circuit 458 has a plurality of inputs coupled to the second subset of the plurality of write word lines and an output coupled to the second inverter 204 for disabling the second inverter 204.

In another aspect of the multi-port memory cell 112, the first feedback control circuit 438 can comprise a logic circuit 440/442 having the plurality of inputs coupled to the first subset of write word lines and an output coupled to a disable input of the first inverter 206.

In another aspect of the multi-port memory cell 112, the logic circuit 438 performs an OR function.

In another aspect of the multi-port memory cell 112, the first selection circuit 202 can comprise a multiplexor 202, 506 coupled to the first subset of the plurality of write bit lines.

In another aspect of the multi-port memory cell 112, the first selection circuit 576 further can comprise a third inverter 579 having an input coupled to an output of the multiplexor 506 and an output coupled to the input of the second inverter 514 and the output of the first inverter 516.

In another aspect of the multi-port memory cell 112, the third inverter can be enabled when the feedback circuit or first inverter 516 is disabled.

In another aspect of the multi-port memory cell 112, a first feedback control circuit 438 has a plurality of inputs coupled to the first subset of write word lines and an output coupled to the first inverter 206 for disabling the first inverter 206. A second feedback control circuit 458 has a plurality of inputs coupled to the second subset of write word lines and an output coupled to the second inverter 204 for disabling the second inverter 204.

In another aspect of the multi-port memory cell 112, the first selection circuit 202 can comprise a plurality of write ports or transmission gates 402, 404, 406, 408 having first signal terminals coupled to the first subset of write bit lines, second signal terminals coupled to the input of the second inverter 204 and output of the first inverter 206, and control inputs coupled to the first subset of write word lines.

In another aspect of the multi-port memory cell 112, a first read circuit 422 has a signal input coupled to the output of the first inverter 206, a plurality of outputs coupled to a first plurality of read bit lines RBL0-1; and a plurality of select inputs RWL0, RWL1 coupled to a first plurality of read word lines. A second read circuit 424 has a signal input coupled to the output of the second inverter 204, a plurality of outputs coupled to a second plurality of read bit lines RBL2-3; and a plurality of select inputs coupled to a second plurality of read word lines RWL2-3.

In another embodiment, a multi-port memory cell 112 of a multi-port memory array 104 can comprise a storage circuit 204/206 that includes a first inverter 206 having an input and an output. The first inverter 206 can be disabled by a plurality of write word lines WWL0-3. A second inverter 204 has an input coupled to the output of the first inverter 206 and an output coupled to the input of the first inverter 206. A first selection circuit 202 has data inputs coupled to a plurality of write bit lines WBL0-3, selection inputs coupled to the plurality of write word lines WWL0-3, and an output coupled to the input of the second inverter 204. A first feedback control circuit 438 has a plurality of inputs coupled to the plurality of write word lines and an output coupled to the first inverter 206 for disabling the first inverter 206 by the plurality of write word lines WWL0-3.

In another aspect of the multi-port cell 112, the first feedback control circuit 438 can comprise a logic circuit 440 having the plurality of inputs coupled to the plurality of write word lines WWL0-3 and an output coupled to a disable input of the first inverter 206.

In another aspect of the multi-port cell 112, the logic circuit 440/442 performs an OR function and a NOR function.

In another aspect of the multi-port cell 112, a second feedback control circuit 458 having a logic circuit 440/442 having the plurality of inputs coupled to a second plurality of write word lines and an output coupled to a disable input of the second inverter 204 for disabling the second inverter 204 by the second plurality of write word lines.

In yet another embodiment, a method of operating a multi-port memory cell 112 of a multi-port memory array 104 having a first inverter 204 having an input and an output and a second inverter 206 having an input coupled to the output of the first inverter 204 and an output coupled to the input of first inverter 204, can comprise selecting a write bit line among a plurality of write bit lines for coupling to the first and second inverters 206. If the selected write bit line can be from a first subset WBL0-3 of the plurality of write bit lines, coupling the selected bit line to the input of the first inverter 204 and disabling the second inverter 206 to stop feedback from the second inverter 206 to the first inverter 204, and then enabling the second inverter 206 to complete the feedback from the second inverter 206 to the first inverter 204. If the selected write bit line is from a second subset WBL4-7 of the plurality of write bit lines, coupling the selected bit line to the input of the second inverter 206 and disabling the first inverter 204 to stop feedback from the first inverter 204 to the second inverter 206, and then enabling the first inverter 204 to complete the feedback from the first inverter 204 to the second inverter 206.

In another aspect of the method, the selecting can comprise using a plurality of write word lines can comprise a first subset of write word lines and a second subset of write word lines.

In another aspect of the method, the selecting can be further characterized by selecting a write bit line from the first subset of the plurality of write bit lines if a write word line from the first subset of write word lines is asserted.

In another aspect of the method, the disabling and then enabling the second inverter 206 can be controlled by the first subset of write word lines and the disabling and then enabling the first inverter 204 is controlled by the second subset of write word lines.

In another aspect of the method, performing a read by coupling the output of first inverter 204 to a first output circuit 424 if the read is selected by a read word line from a first subset of read word lines and by coupling the output of the second inverter 206 to a second output circuit 422 if the read is selected by a read word line from a second subset of read word lines.

In another aspect of the method, the selecting a write bit line can be performed using a first multiplexor 202 if the selected bit line is from the first subset of the plurality of write bit lines and a second multiplexor 208 if the selected bit line is from the second subset of plurality of write bit lines.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, the letter "b" following the name, or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are located on a single integrated circuit or within a same device. Alternatively, system 100 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-port memory cell of a multi-port memory array, wherein the multi-port memory cell is written using a plurality of write word lines and a plurality of write bit lines, comprising:
   a storage circuit comprising:
      a first inverter having an input and an output, wherein the first inverter is disabled by a first subset of the plurality of write word lines; and
      a second inverter having an input coupled to the output of the first inverter and an output coupled to the input of the first inverter, wherein the second inverter is disabled by a second subset of the plurality of write word lines;
   a first selection circuit having data inputs coupled to a first subset of the plurality of write bit lines, selection inputs coupled to the first subset of the plurality of write word lines, and an output coupled to the input of the second inverter; and
   a second selection circuit having data inputs coupled to a second subset of the plurality of write bit lines, selection inputs coupled to the second subset of the plurality of write word lines, and an output coupled to the input of the first inverter.

2. The multi-port memory cell of claim 1, further comprising:
   a first feedback control circuit having a plurality of inputs coupled to the first subset of the plurality write word lines and an output coupled to the first inverter for disabling the first inverter; and
   a second feedback control circuit having a plurality of inputs coupled to the second subset of the plurality of write word lines and an output coupled to the second inverter for disabling the second inverter.

3. The multi-port memory cell of claim 2, wherein the first feedback control circuit comprises a logic circuit having the plurality of inputs coupled to the first subset of write word lines and an output coupled to a disable input of the first inverter.

4. The multi-port memory cell of claim 3, wherein the logic circuit performs a NOR function and an OR function.

5. The multi-port memory cell of claim 1, wherein the first selection circuit comprises a multiplexor coupled to the first subset of the plurality of write bit lines.

6. The multi-port memory cell of claim 5, wherein the first selection circuit further comprises a third inverter having an input coupled to an output of the multiplexor and an output coupled to the input of the second inverter and the output of the first inverter.

7. The multi-port memory cell of claim 6, wherein the third inverter is enabled when the first inverter is disabled.

8. The multi-port memory cell of claim 7, further comprising:
   a first feedback control circuit having a plurality of inputs coupled to the first subset of write word lines and an output coupled to the first inverter for disabling the first inverter; and
   a second feedback control circuit having a plurality of inputs coupled to the second subset of write word lines and an output coupled to the second inverter for disabling the second inverter.

9. The multi-port memory cell of claim 1, wherein the first selection circuit comprises a plurality of transmission gates having first signal terminals coupled to the first subset of write bit lines, second signal terminals coupled to the input of the second inverter and output of the first inverter, and control inputs coupled to the first subset of write word lines.

10. The multi-bit memory cell of claim 1, further comprising:
   a first read circuit having a signal input coupled to the output of the first inverter, a plurality of outputs coupled to a first plurality of read bit lines; and a plurality of select inputs coupled to a first plurality of read word lines; and
   a second read circuit having a signal input coupled to the output of the second inverter, a plurality of outputs coupled to a second plurality of read bit lines; and a plurality of select inputs coupled to a second plurality of read word lines.

11. A multi-port memory cell of a multi-port memory array, comprising:
   a storage circuit comprising:
      a first inverter having an input and an output, wherein the first inverter is disabled by a plurality of write word lines; and
      a second inverter having an input coupled to the output of the first inverter and an output coupled to the input of the first inverter;
   a first selection circuit having data inputs coupled to a plurality of write bit lines, selection inputs coupled to the plurality of write word lines, and an output coupled to the input of the second inverter; and
   a first feedback control circuit having a plurality of inputs coupled to the plurality of write word lines and an output coupled to the first inverter for disabling the first inverter by the plurality of write word lines.

12. The multi-port memory cell of claim 11, wherein the first feedback control circuit comprises a logic circuit having the plurality of inputs coupled to the first plurality of write word lines and an output coupled to a disable input of the first inverter.

13. The multi-port memory cell of claim 12, wherein the logic circuit performs an OR function and a NOR function.

14. The multi-port memory of claim 12, further comprising a second feedback control circuit having a logic circuit having the plurality of inputs coupled to a second plurality of write word lines and an output coupled to a disable input of the second inverter for disabling the second inverter by the second plurality of write word lines.

15. A method of operating a multi-port memory cell of a multi-port memory array having a first inverter having an input and an output and a second inverter having an input coupled to the output of the first inverter and an output coupled to the input of first inverter, comprising:
   selecting a write bit line among a plurality of write bit lines for coupling to the first and second inverters, wherein:
      if the selected write bit line is from a first subset of the plurality of write bit lines, coupling the selected bit line to the input of the first inverter and disabling the second inverter to stop feedback from the second inverter to the first inverter, and then enabling the second inverter to complete the feedback from the second inverter to the first inverter; and
      if the selected write bit line is from a second subset of the plurality of write bit lines, coupling the selected bit line to the input of the second inverter and disabling the first inverter to stop feedback from the first inverter to the second inverter, and then enabling the first inverter to complete the feedback from the first inverter to the second inverter.

16. The method of claim 15, wherein the selecting comprises using a plurality of write word lines comprising a first subset of write word lines and a second subset of write word lines.

17. The method of claim 16, wherein the selecting is further characterized by selecting a write bit line from the first subset of the plurality of write bit lines if a write word line from the first subset of write word lines is asserted.

18. The method of claim 17, wherein the disabling and then enabling the second inverter is controlled by the first subset of write word lines and the disabling and then enabling the first inverter is controlled by the second subset of write word lines.

19. The method of claim 18, further comprising performing a read by coupling the output of first inverter to a first output circuit if the read is selected by a read word line from a first subset of read word lines and by coupling the output of the second inverter to a second output circuit if the read is selected by a read word line from a second subset of read word lines.

20. The method of claim 19, wherein the selecting a write bit line is performed using a first multiplexor if the selected bit line is from the first subset of the plurality of write bit lines and a second multiplexor if the selected bit line is from the second subset of plurality of write bit lines.

* * * * *